United States Patent
Wu et al.

(10) Patent No.: US 7,352,626 B1
(45) Date of Patent: Apr. 1, 2008

(54) VOLTAGE REGULATOR WITH LESS OVERSHOOT AND FASTER SETTLING TIME

(75) Inventors: Yonggang Wu, Santa Clara, CA (US); Guowei Wang, Cupertino, CA (US); Nian Yang, Mountain View, CA (US); Aaron Lee, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 84 days.

(21) Appl. No.: 11/212,614

(22) Filed: Aug. 29, 2005

(51) Int. Cl.
*G11C 11/34* (2006.01)
*G11C 7/00* (2006.01)

(52) U.S. Cl. .......................... 365/185.18; 365/185.21; 365/185.23; 365/203; 365/207; 365/226

(58) Field of Classification Search ........... 365/185.01, 365/185.18, 185.21, 185.23, 185.25, 185.33, 365/207, 203, 205, 208, 226
See application file for complete search history.

(56) References Cited

U.S. PATENT DOCUMENTS

| | | | |
|---|---|---|---|
| 5,291,446 A | 3/1994 | Van Buskirk et al. | 365/189.09 |
| 5,539,688 A | 7/1996 | Yiu et al. | 365/185.18 |
| 5,748,534 A * | 5/1998 | Dunlap et al. | 365/185.21 |
| 5,757,711 A * | 5/1998 | Nakaoka et al. | 365/207 |
| 5,890,192 A | 3/1999 | Lee et al. | 711/103 |
| 6,163,483 A * | 12/2000 | Pasotti et al. | 365/185.23 |
| 6,259,635 B1 * | 7/2001 | Khouri et al. | 365/185.18 |
| 6,295,228 B1 | 9/2001 | Pawletko et al. | 365/185.22 |
| 6,426,893 B1 | 7/2002 | Conley et al. | 365/185.11 |
| 6,515,903 B1 * | 2/2003 | Le et al. | 365/185.18 |
| 6,519,180 B2 * | 2/2003 | Tran et al. | 365/185.18 |
| 6,535,419 B2 | 3/2003 | Parker et al. | |
| 6,563,745 B1 | 5/2003 | Ilkbahar | 365/189.07 |
| 6,570,785 B1 | 5/2003 | Mangan et al. | 365/185.02 |
| 6,597,619 B2 * | 7/2003 | Stubbs et al. | 365/226 |
| 6,665,215 B2 * | 12/2003 | Thomas et al. | 365/185.25 |
| 6,687,159 B2 * | 2/2004 | Pasotti et al. | 365/185.18 |
| 6,735,117 B2 * | 5/2004 | Ott | 365/185.18 |
| 6,842,388 B2 * | 1/2005 | Origasa et al. | 365/203 |
| 6,906,966 B2 * | 6/2005 | Shor et al. | 365/185.23 |
| 6,914,835 B2 * | 7/2005 | Nakamura et al. | 365/203 |
| 6,947,347 B2 * | 9/2005 | Fujioka | 365/185.33 |

(Continued)

OTHER PUBLICATIONS

2002 IEEE International Solid-State Circuits Conference, Session 6, "SRAM and Non-Volatile Memories", Feb. 4, 2004, 6 pages.

(Continued)

*Primary Examiner*—Trong Phan
(74) *Attorney, Agent, or Firm*—Harrity Snyder, LLP

(57) ABSTRACT

A voltage regulator may include an operational-amplifier section, a capacitor connected to an output of the operational-amplifier section, and a switch configured to connect the capacitor to a voltage supply. The switch is configured to charge the capacitor before activating the operational-amplifier section. The capacitor is configured to store charge to supplement current being supplied from the operational-amplifier section. The voltage regulator may be used to supply power to non-volatile memory cells.

14 Claims, 10 Drawing Sheets

U.S. PATENT DOCUMENTS

| | | | |
|---|---|---|---|
| 7,057,939 B2 | 6/2006 | Li et al. | 365/185.28 |
| 7,154,794 B2 * | 12/2006 | Ahne et al. | 365/185.18 |
| 7,177,184 B2 | 2/2007 | Chen | |
| 2002/0167844 A1 | 11/2002 | Han et al. | 365/185.28 |
| 2003/0046481 A1 | 3/2003 | Kushnarenko | 711/103 |
| 2003/0142544 A1 | 7/2003 | Maayan et al. | 365/185.16 |
| 2004/0027857 A1 | 2/2004 | Ooishi | 365/185.11 |
| 2004/0037113 A1 | 2/2004 | Ooishi | 365/185.11 |
| 2004/0109354 A1 | 6/2004 | Wang et al. | 365/185.11 |
| 2007/0035991 A1 * | 2/2007 | Chen et al. | |

OTHER PUBLICATIONS

2002 IEEE International Solid-State Circuits Conference, 29 pages.

Co-pending U.S. Appl. No. 11/229,529, filed Sep. 20, 2005, entitled: "Flash Memory Programming with Data Dependent Control of Source Lines," Guowei Wang et al.; 30 pp.

Co-pending U.S. Appl. No. 11/229,664, filed Sep. 20, 2005, entitled: "Flash Memory Programming Using an Indication Bit to Interpret State," Takao Akaogi et al.; 25 pp.

* cited by examiner

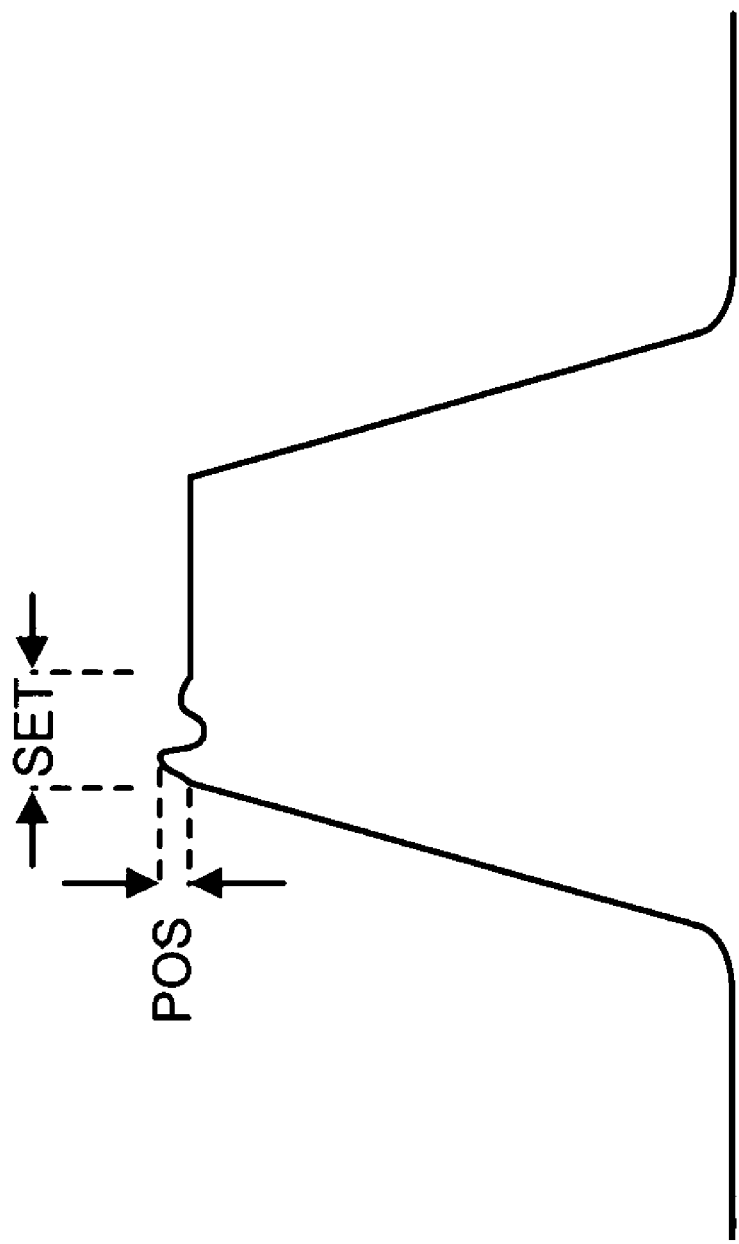

VOLTAGE REGULATOR WITH LESS OVERSHOOT AND FASTER SETTLING TIME

TECHNICAL FIELD

The present invention relates generally to electronic circuits, and more specifically, to voltage regulator circuits.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

When programming and erasing NOR-type Flash memory cells, multiple memory cells may be programmed at once. In a programming operation, each cell being programmed acts as a load to the power generation and supply circuitry in the memory device. Ideally, the power generation and supply circuitry should provide a stable and consistent output power supply to the memory cells.

A voltage regulator circuit may be used to help stabilize power supplied to the memory cells during programming, reading, or erasing of the memory cells. FIG. 1 is a diagram illustrating one existing implementation of a voltage regulator.

As shown in FIG. 1, a voltage regulator 100 includes a two-stage operational-amplifier (op-amp) section 110, a load capacitor $C_1$, and a resistor R. $C_1$ and R are connected in parallel and to the output of op-amp section 110. Op-amp section 110 includes an op-amp 115 connected as a differential amplifier that outputs a signal to a unity gain op-amp 120. Power lines, not shown, may also be connected op-amps 115 and 120. The positive terminal of op-amp 115 is connected to $V_{ref}$, which is set to a reference voltage that is desired at the output of the voltage regulator ($V_{out}$). The negative terminal of op-amp 115 receives feedback from $V_{out}$. Capacitor $C_c$ is connected between the output and input of unity gain op-amp 120.

In operation, the feedback path from $V_{out}$ to the negative terminal of op-amp 115 tends to stabilize $V_{out}$ to output a voltage equal to $V_{ref}$. $C_1$ may be a relatively large capacitor that is used to compensate for load variations in the circuitry connected to $V_{out}$. For example, if the load increases to temporarily draw more current than can be supplied from the output of op-amp 120, $C_1$ may temporarily make up the difference.

In situations in which the load seen by voltage regulator 100 changes quickly and/or significantly, $V_{out}$ may exhibit relatively large overshoot and long settling times. This can negatively impact the circuitry that draws power from $V_{out}$. For example, in the situation where this circuitry is an array of flash memory cells, relatively large overshoot and long settling times can negatively impact the programming, erasing, or reading speed of the memory cells. Accordingly, it is desirable to minimize the overshoot and/or settling time of the voltage regulator.

DISCLOSURE OF THE INVENTION

One aspect is directed to a memory device comprising at least one array of non-volatile memory cells, each of the non-volatile memory cells being associated with at least one bit line and a word line. A voltage supply component is configured to supply power to the at least one array of non-volatile memory cells. The voltage supply component includes a voltage regulator that includes: an operational-amplifier section; a capacitor connected to an output of the operational-amplifier section; and a switch configured to connect the capacitor and the output of the operational-amplifier section to a voltage supply, the switch being operated to pre-charge the capacitor.

Another aspect is directed to a voltage regulator that includes a two-stage operational-amplifier section that includes a first operational-amplifier configured as a differential operational-amplifier and a second operational-amplifier configured as a unity gain operational amplifier. The second operational-amplifier includes an input connected to an output of the first operational-amplifier and an output connected as an output of the two-stage operational-amplifier section. The voltage regulator additionally includes a capacitor connected to an output of the two-stage operational-amplifier section and a switch configured to connect the capacitor and the output of the two-stage operational-amplifier section to a voltage supply. The switch is operated to pre-charge the capacitor.

BRIEF DESCRIPTION OF THE DRAWINGS

Reference is made to the attached drawings, wherein elements having the same reference number designation may represent like elements throughout.

FIG. 10 is a diagram illustrating the concepts of pulse overshoot and settling time.

BEST MODE FOR CARRYING OUT THE INVENTION

Techniques described below relate to a voltage regulator that pre-charges a load capacitor. The voltage regulator exhibits less overshoot and improved settling times relative to existing voltage regulators.

Memory Device Overview

Figure 2:
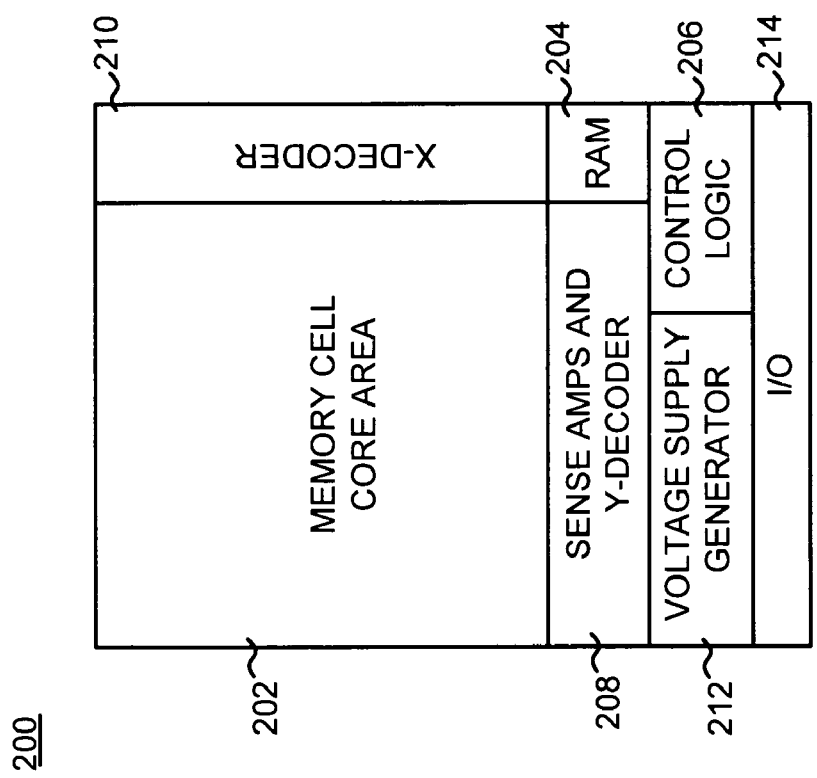
FIG. 2 is a block diagram illustrating an exemplary high-level implementation of a memory device.

FIG. 2 is a block diagram illustrating an exemplary high-level implementation of a memory device 200. Memory device 200 may be a Flash memory device implemented as an integrated circuit. The voltage regulator described herein will be described in the context of memory device 200. However, one of ordinary skill in the art will recognize that the voltage regulator could be used in other environments in which voltage regulation is needed.

As shown in FIG. 2, memory device 200 includes a memory cell core area 202. Core area 202 may include arrays of high density memory cells, such as, for example, SONOS-type (silicon-oxide-nitride-oxide-silicon) NOR memory cells, where the nitride layer acts as the charge storage element. More specifically, core area 202 may include multiple M×N memory arrays of substantially identical memory cells.

The memory cells in core area 202 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell, serves as a binary unit of data (e.g. either "1" or "0"). Reading or programming one side of a memory cell occurs independently of the data that is stored on the opposite side of the cell.

Although shown as a single block in FIG. 2, core area 202 may be implemented as a number of memory cell arrays. Each such memory cell array may be associated with X-decoder 210 and Y-decoder 208. X-decoder 210 and Y-decoder 208 may decode address information, such as addresses received by memory device 200 that define a specific byte or word (or groups of bytes or words) that are to be written to or read from. The decoded addresses specify the appropriate physical lines in the memory cell array(s) that are to be used.

Y-decoder 208 may also include appropriate sense amplifier circuitry. Sense amplifiers may be used to sense the programmed or non-programmed state of the memory cells in core area 202.

Random access memory (RAM) 204 may include memory, such as static dynamic random access memory (SRAM) or dynamic random access memory (DRAM) type memory, that can serve as a memory cache between core area 202 and I/O buffers 214. Relative to the memory cells in core area 202, RAM 204 may be a higher speed memory and may be a volatile memory (i.e., loses its data when powered down). I/O buffers 214 may provide buffering to facilitate data transfer between RAM 204 or core area 202 and circuitry external to memory device 200.

Voltage supply generator 212 may act as a power supply for the programming, reading, and erase functions performed on the memory cells in core area 202. Programming and erasing the memory cells, in particular, may require supply voltages larger than those supplied to memory device 200. For example, memory device 200 may be powered from a 3.5 volt source while a program operation may require a nine volt source. Voltage supply generator 212 may use one or more charge pumps to generate these higher voltages. The output(s) from the charge pumps may be regulated by one or more voltage regulators that connect the charge pumps to core area 202.

Control logic 206 may generally control X-decoder 210, Y-decoder 208, RAM 204, voltage supply generator 212, and I/O buffers 214 to control the reading, programming, and erasing of memory cell core area 202. Control logic 206 may include a state machine that appropriately manipulates memory cell core area 202 based on input address, data, and control signals received by memory device 200 through I/O buffers 214.

Figure 3:
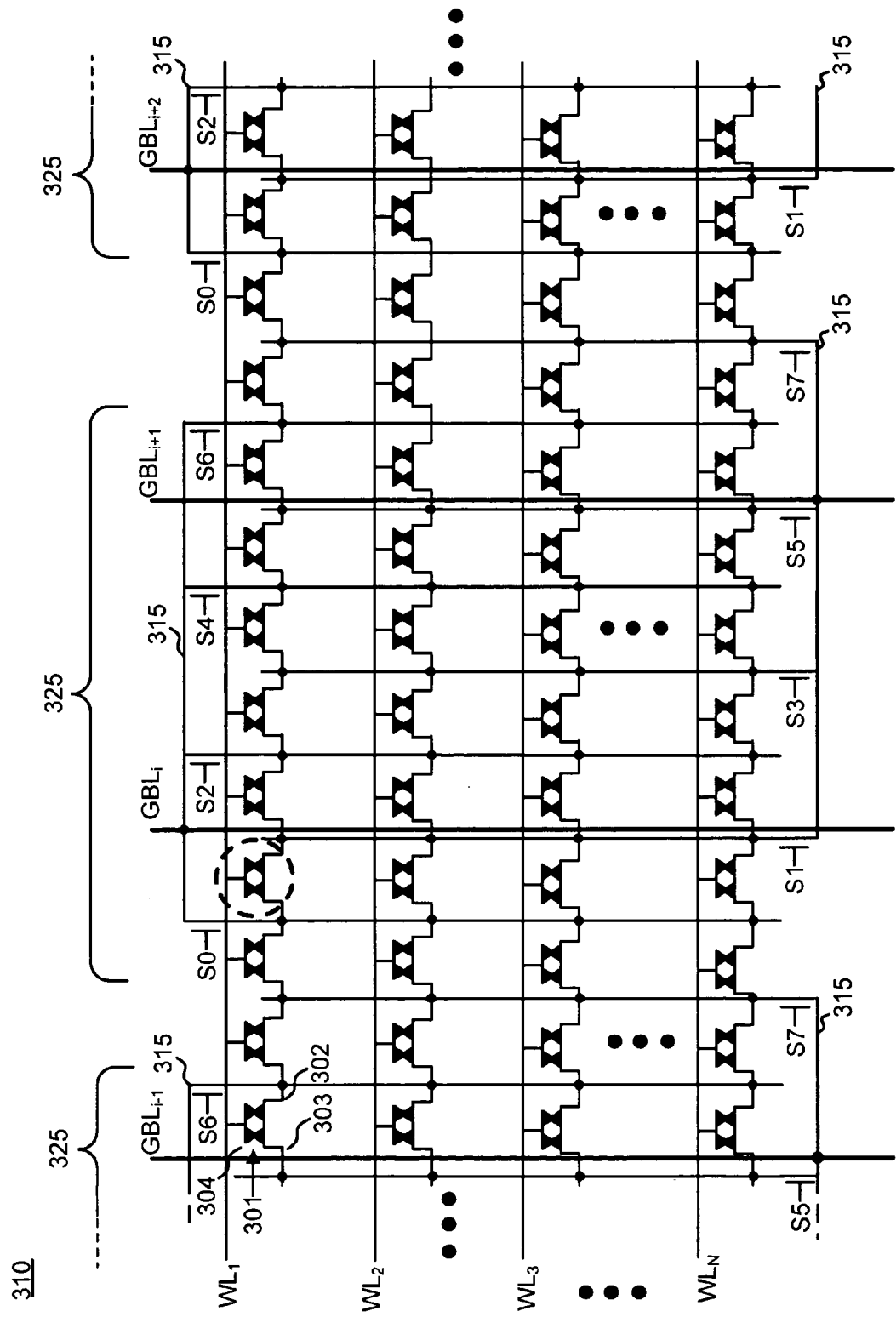
FIG. 3 is a diagram illustrating an exemplary portion of an array of memory cells implemented in the core area shown in FIG. 2.

FIG. 3 is a diagram illustrating an exemplary portion of an array of memory cells implemented in core area 202, labeled as memory array 310. The array includes a number of substantially identical memory cells 301. Each memory cell 301 includes a drain 302, a source 303, and a stacked gate region 304. Drain 302 and source 303 are interchangeable within a memory cell depending on the applied voltages and may be switched with respect to one another. The NOR configuration illustrated in FIG. 3 includes word lines (word lines $WL_1$ through $WL_N$) each connected to the gate region 304 of a number of memory cells 301 in a row. Bit lines are arranged orthogonally to the word lines in array 310. The bit lines include global bit lines ($GBL_{i-1}$ through $GBL_{i+2}$) that each connect to one or more additional bit lines 315. Voltages placed on additional bit lines 315 via a global bit line GBL may be controlled through select transistors (also called select switches) S0 through S7.

As illustrated in FIG. 3, select transistors S0 through S7 may be arranged in repeating groups 325 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells in memory array 310. By also activating a word line WL, one memory cell in each group 325 may have its source, drain, and gate terminals all activated, thus allowing programming or reading of this select memory cell 301. As an example of selecting a particular memory cell 301 within a group 325 (e.g., the memory cell within the dotted circle in FIG. 3), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 301 in other groups 325 can be simultaneously selected based on activation of the same WL and select transistors.

Although the memory cells 301 in core area 202 are shown as NOR memory cells, in some implementations, the circuitry in the peripheral regions of memory device 200 may provide an external interface that mimics an external interface normally provided by NAND-type Flash memories. In this situation, memory device 200, from the point of view of the user/circuit designer, can effectively be thought of as a NAND-type Flash device, even though core area 202 includes NOR-type Flash memory.

Although only a limited number of memory cells 301 are shown in FIG. 3, one of ordinary skill in the art will recognize that a typical memory cell architecture will include many more cells in an array. For instance, in one implementation, core array 202 may include multiple memory cell arrays, each including 2048 bit lines and 256 word lines. The 2048 bit lines correspond to 256 eight memory cell groups 225 of select transistors.

Figure 4:
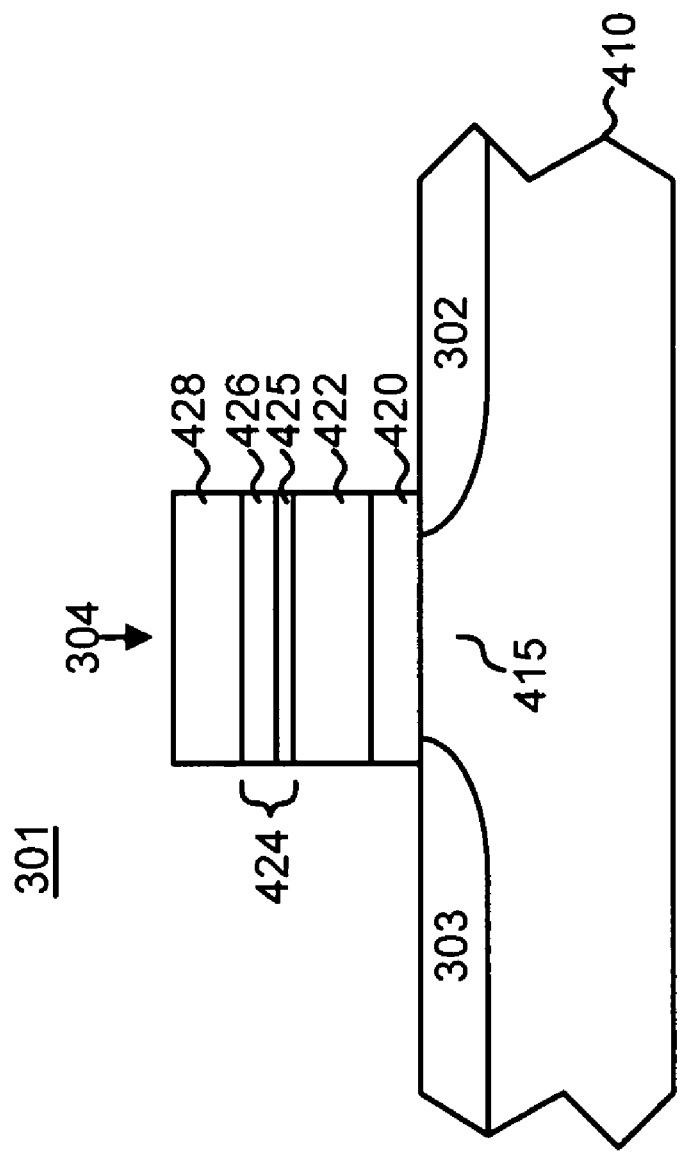
FIGS. 4 and 5 are diagrams illustrating a cross-section of an exemplary one of the memory cells shown in FIG. 3.

FIG. 4 is a diagram illustrating a cross-section of an exemplary one of memory cells 301 in more detail. Memory cell 301 may be formed on a substrate 410 and includes drain 302, source 303, and stacked gate 304. Substrate 410 may be formed of a semiconducting material such as silicon, germanium, or silicon-germanium. Drain and source regions 302 and 303, respectively, may be regions that are doped with n-type impurities, such as phosphorous or arsenic, or p-type impurities, such as boron. As previously mentioned, depending on the applied voltage values, the functions of drain and source regions 302 and 303 may be reversed.

As shown in FIG. 4, stacked gate 304 is formed on channel region 415. Stacked gate 304 includes a number of layers, including a relatively thin gate dielectric layer 420, a charge storage layer 422, a second dielectric layer 424, and a control gate 428. Dielectric layer 420 may include an oxide, such as a silicon oxide (e.g., $SiO_2$).

Charge storage layer 422 may be formed on gate dielectric layer 420 and may include a dielectric material, such as a nitride (e.g., a silicon nitride). Layer 422 acts as a charge storage layer for memory cell 301.

Charge storage layer 422 may be used to store one or more bits of information. In an exemplary implementation, charge storage layer 422 may store charges representing two separate bits of data by localizing the first and second charges to the respective left and right sides of charge storage layer 422. Each of the two charges of the memory cell 301 may be programmed independently by, for example, channel hot electron injection, to store a charge on each respective side of the charge storage layer 422. In this manner, the charges in charge storage layer 422 become effectively trapped on each respective side of charge storage layer 422 and the density of the resulting memory array may be increased as compared to memory devices that store only one bit of data per cell. In alternate implementations, charge storage layer 422 may store charges representing three or more bits of data for each memory cell 301.

Second dielectric layer 424 may be formed on layer 422 and may include a multi-layer structure, such as a first silicon oxide layer 425 and a second high dielectric constant (high-K) layer 426. High-K layer 426 may include, for example, an alumina, such as $Al_2O_3$. Dielectric layers 425 and 426 may together function as an inter-gate dielectric for memory cells 301. In alternate implementations, dielectric layer 424 may include a single layer, such as a silicon oxide or alumina.

Control gate 428 may be formed above second dielectric layer 424. Control gate 428 may be formed of, for example, polysilicon and may be connected to the word line of memory cell 301.

In operation, memory cells 301 in core array 202 may be programmed by applying a relatively high voltage (e.g., 9 volts) to one of the word lines WL, such as $WL_1$, which effectively applies the voltage to control gates 428 of the memory cells that are coupled to $WL_1$. Simultaneously, a voltage may be applied across drain 302 and source 303 of one of the memory cells in a group 225. For example, approximately five volts may be applied to $GBL_i$ and $GBL_{i+1}$ may be grounded. Also, select transistors S0 and S1 may be turned on by applying an appropriate voltage to S1. These voltages generate a vertical and lateral electric field in the activated memory cell(s) (e.g., the circled memory cell in FIG. 3) along the length of the channel from the source to the drain. These electric fields causes electrons to be drawn off the source and begin accelerating toward the drain. As they move along the length of the channel, they gain energy. If they gain enough energy, they can jump over the potential barrier of the dielectric layer 420 into one side of charge storage layer 422 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 5:
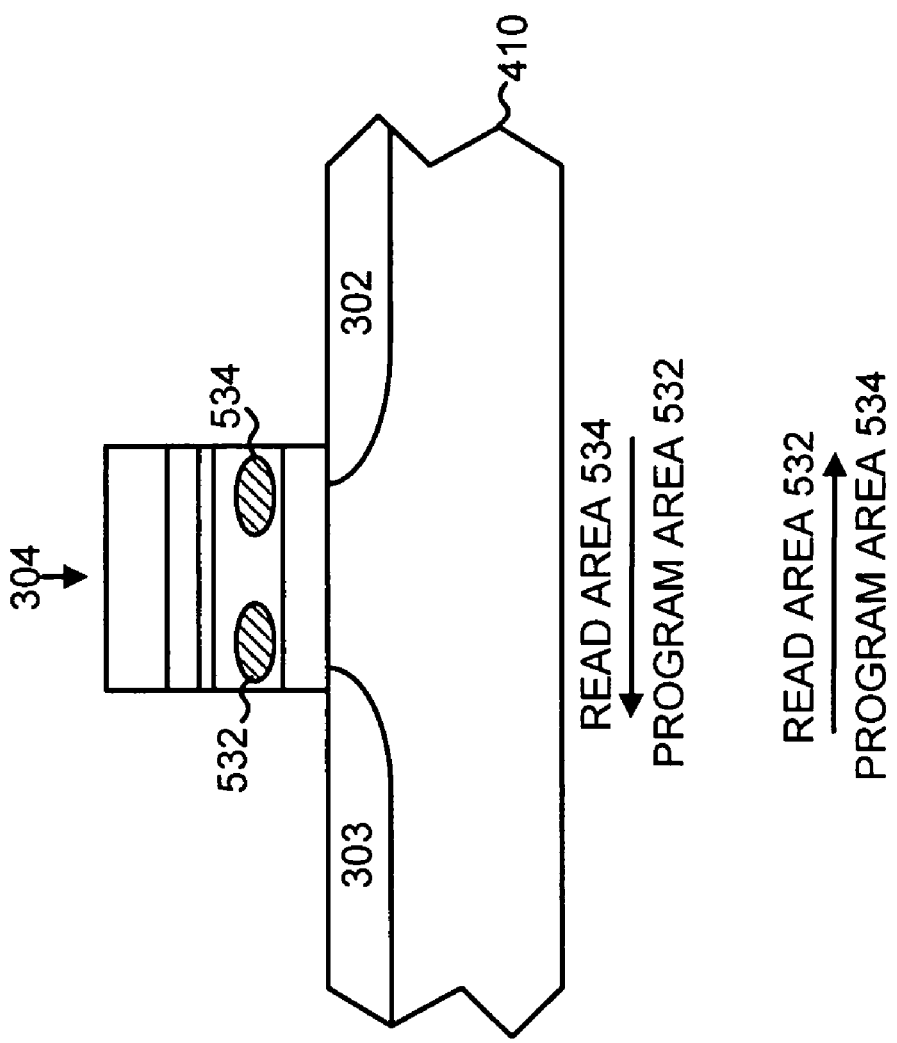

When two bits are stored in charge storage layer 422, the second bit is programmed in a manner similar to the first bit, except that the source and drain terminals are reversed in both directions. FIG. 5 is a diagram illustrating a cross-section of the exemplary memory cell 301 shown in FIG. 4. Additionally, FIG. 5 illustrates read and program directions for when memory cell 301 is used to store charges representing two independent bits. Memory cell 301 includes two separate charge storage areas 532 and 534 within the charge storage layer. Each storage area 532 and 534 may define one bit. To program the left area 532 or read the right area 534, area 303 acts as the drain and receives a high voltage relative to area 302, which acts as the source. To program the right area 534 or read the left area 532, area 302 acts as the drain and receives a high voltage relative to area 303, which acts as the source. The arrows in FIG. 5 graphically illustrate the direction of charge flow.

Voltage Supply Generator 212

Figure 6:
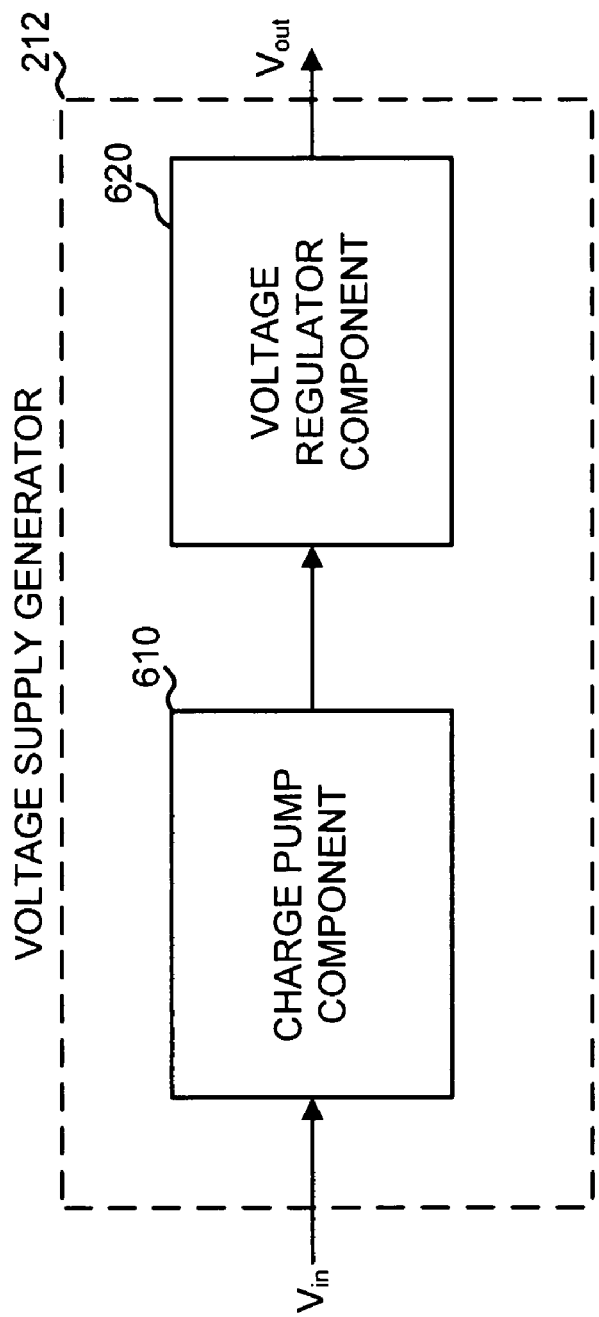
FIG. 6 is an diagram illustrating exemplary portions of the voltage supply generator shown in FIG. 2 in additional detail.

FIG. 6 is an diagram illustrating exemplary portions of voltage supply generator 212 in additional detail. As shown, voltage supply generator 212 may include a charge pump component 610 and a voltage regulator component 620. Charge pump component 610 may include one or more charge pumps that generally function to generate voltages appropriate for performing operations, such as erasing and/or programming the memory cells in core area 202. A charge pump, as is generally known in the art, may include a series of stages that each include diode(s) and capacitor(s) that are operated to "push" charge through the various stages of the charge pump in order to provide a higher output voltage than the input supply voltage.

Figure 7:
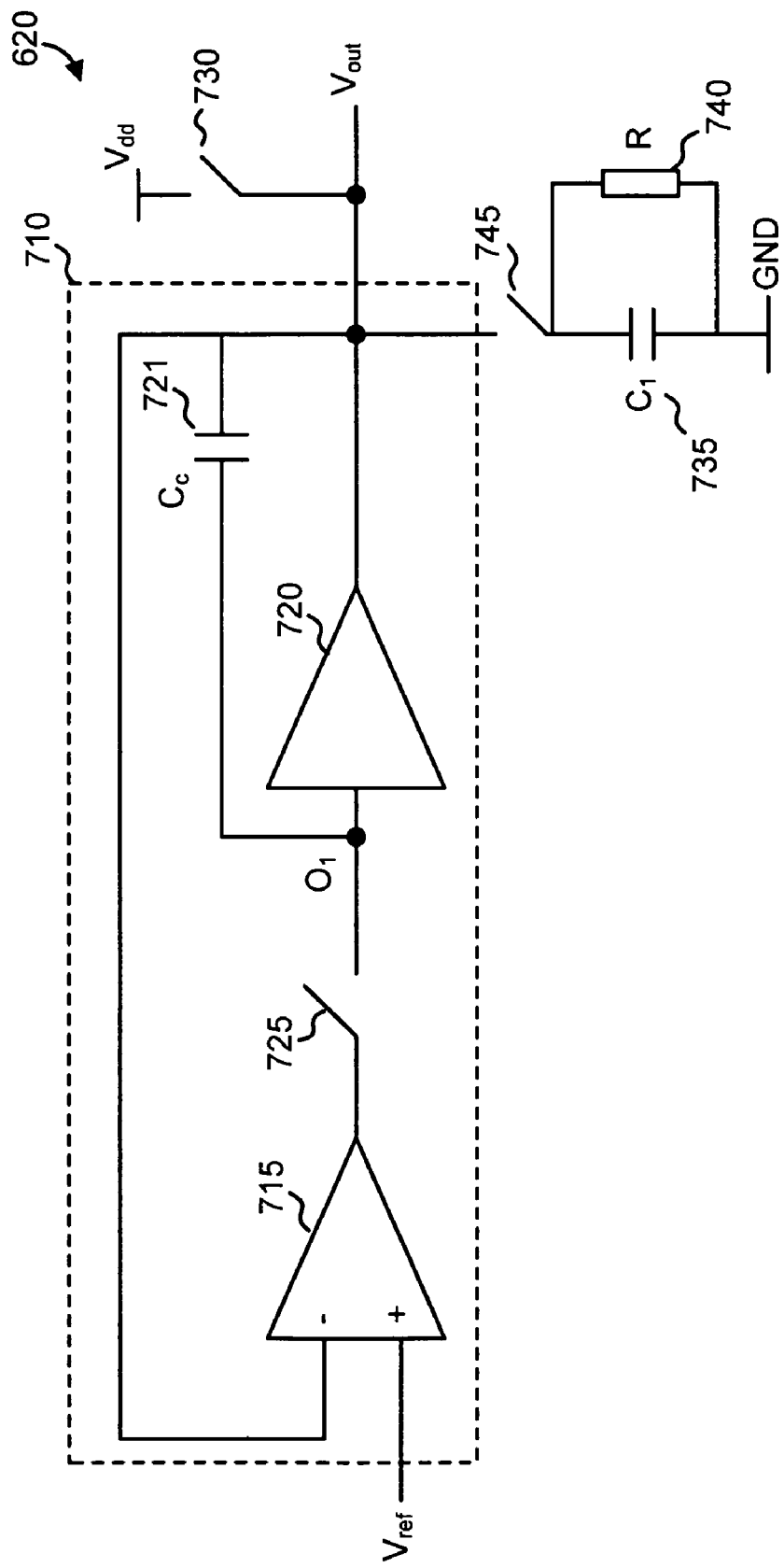
FIG. 7 is a diagram illustrating an implementation of a voltage regulator component consistent with an aspect of the invention.

Based on the input power supplied from charge pump component 610, voltage regulator component 620 may provide a regulated voltage source for core area 202. FIG. 7 is a diagram illustrating an implementation of voltage regulator component 620.

As shown in FIG. 7, voltage regulator component 620 includes a two-stage op-amp section 710. Op-amp section 710 includes an op-amp 715 connected as a differential amplifier that outputs a signal to a unity gain op-amp 720. Capacitor $C_c$ 721 is connected between $V_{out}$ and the input of unity gain op-amp 720. Op-amp section 710 additionally includes a switch 725 between op-amp 715 and op-amp 720. Power lines, such as lines from charge pump component 610 (not shown) may also be connected to op-amps 715 and 720.

$V_{ref}$ may be controlled by control logic 206 to be set at the voltage value required by $V_{out}$ for the particular memory operation that is to be performed. For example, for a program operation for core area 202, $V_{out}$ may be controlled to be approximately 5 volts.

A second switch, labeled as switch 730, may connect $V_{out}$ to a supply voltage, $V_{dd}$, such as a voltage line from charge pump component 610.

Capacitor $C_1$ 735 and resistor R 740 are connected in parallel and may also be connected to node $V_{out}$ via a third switch 745. Resistor R 740 may be a discrete resistor or a resistance that is inherent in the construction of the circuit, such as resistor that models a leakage resistance of the circuit.

Switches 725, 730, and 745 may be semiconductor transistors. As used herein, a closed switch is one that is "on" (i.e., in a conductive state) while an open switch refers to a switch that is "off" (i.e., in a non-conducting state).

Figure 1:
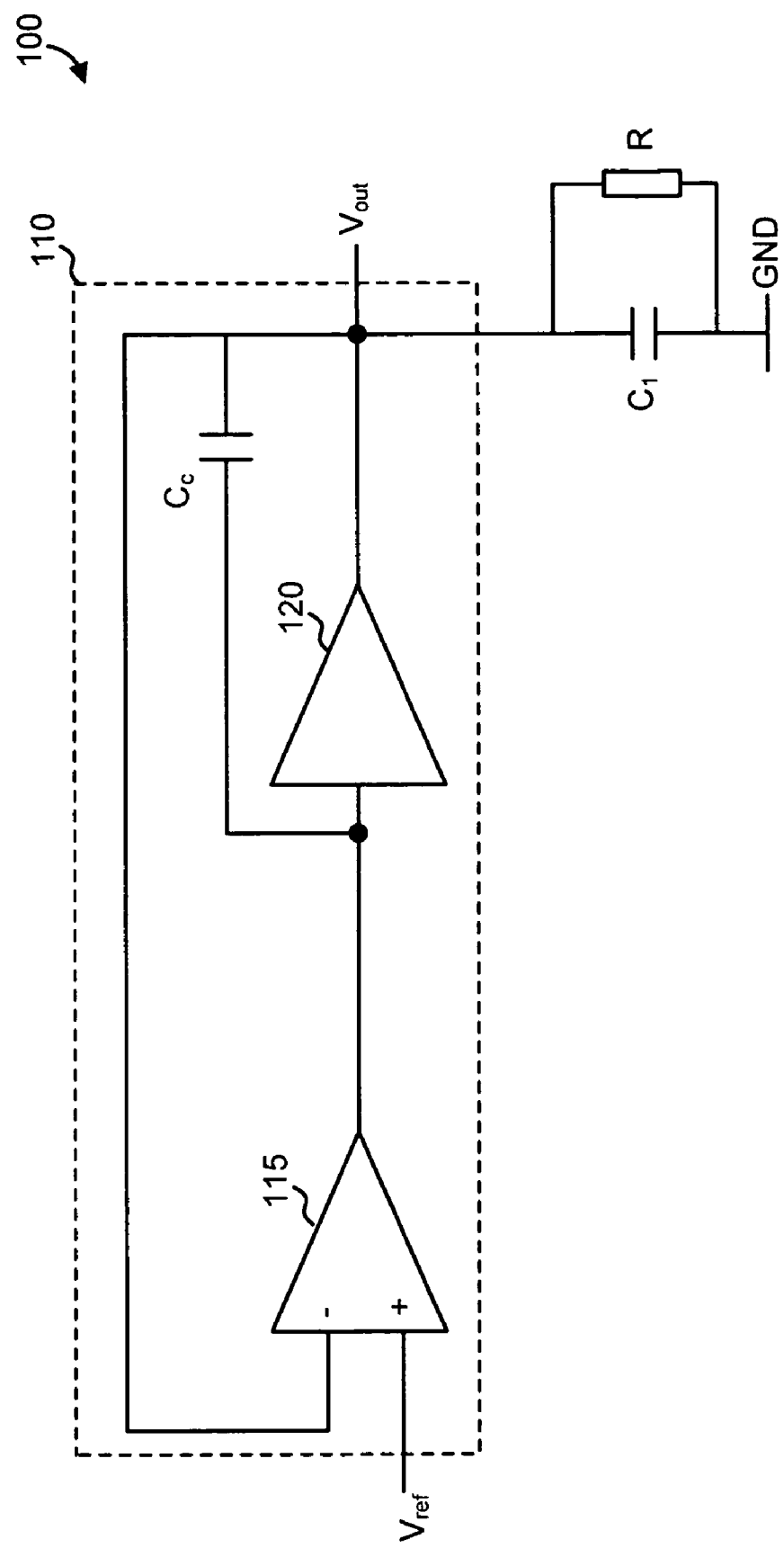
FIG. 1 is a diagram illustrating one existing implementation of a voltage regulator.

In operation, control logic 206 may initially pre-charge capacitor $C_1$ 735 by closing switches 730 and 745, and by opening switch 725. This creates a conductive path between $V_{dd}$ and capacitor $C_1$ 735, through which capacitor $C_1$ 735 charges. Due to this pre-charging of capacitor $C_1$ 735, when switch 725 is turned on and switch 730 is turned off, node $V_{out}$ will reach the intended voltage $V_{ref}$ relatively quickly. A consequence of this is that relative to the existing voltage regulator shown in FIG. 1, voltage regulator component 620 exhibits less overshoot and faster settling times.

One of ordinary skill in the art will recognize that the elements shown in FIG. 7 could be implemented with many different values. For example, in one implementation capacitor $C_c$ 721 may be approximately 2 pico-Farads, capacitor $C_1$ 735 may be approximately 280 pico-Farads, and resistor R 740 may be approximately 1000 ohms.

Figure 8:
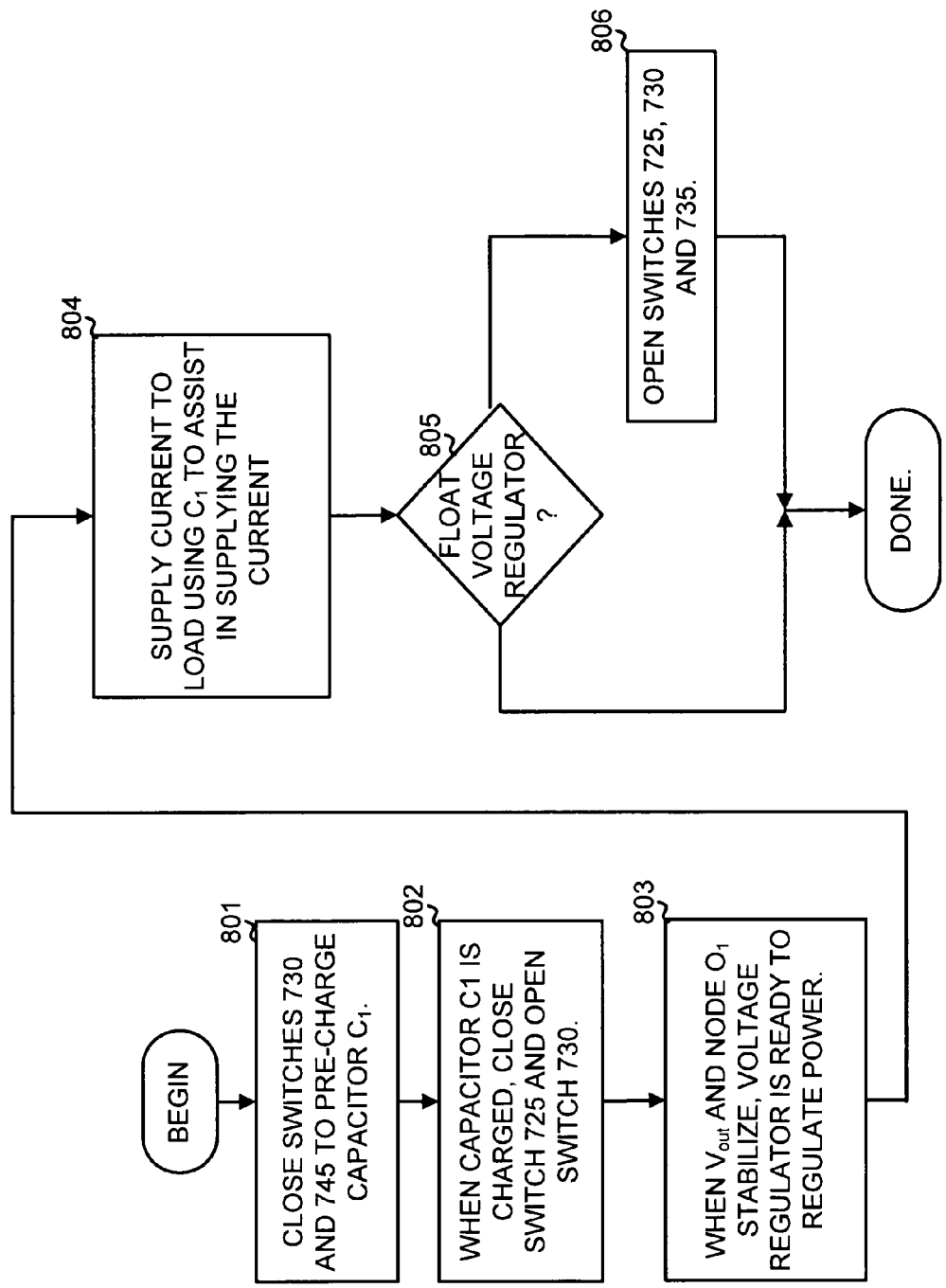
FIG. 8 is a flow chart illustrating exemplary operations of the voltage regulator component shown in FIG. 7.
Figure 9:
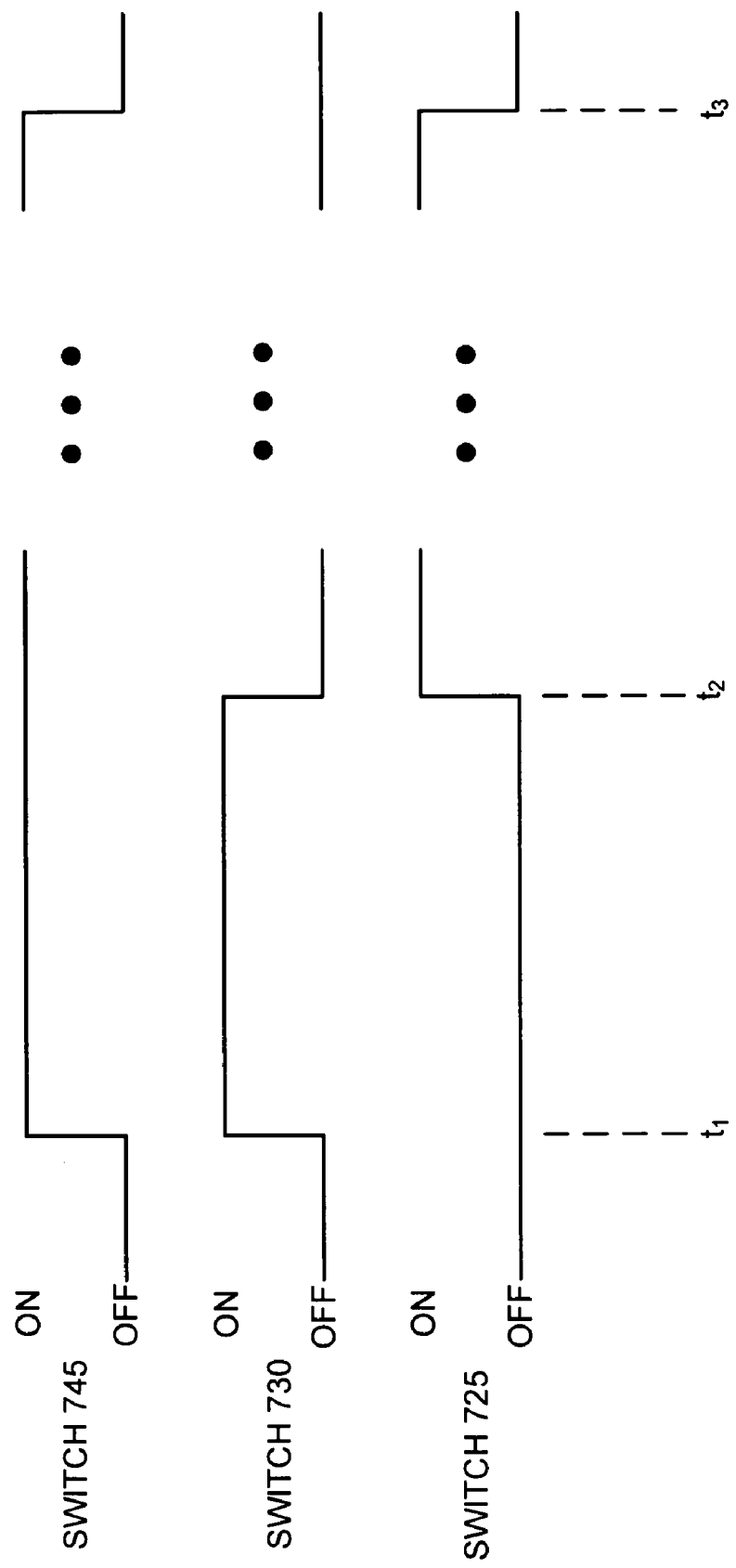
FIG. 9 is a timing diagram illustrating exemplary timing of switches in the voltage regulator component shown in FIG. 7.

The operation of voltage regulator component 620 will now be described in additional detail with reference to FIGS. 8 and 9. FIG. 8 is a flow chart illustrating exemplary operations of voltage regulator component 620 during a memory program operation. FIG. 9 is a timing diagram illustrating exemplary timing of switches 725, 730, and 745 in the operation shown in the flow chart of FIG. 8.

Voltage regulator component 620 may be used to supply current to core area 202, such as by supplying current to one or more bit lines that are to be simultaneously programmed. To begin, voltage regulator component 620 may pre-charge capacitor $C_1$ 735 by closing switches 730 and 745 and by opening switch 725 (act 801). This act effectively pre-charges capacitor $C_1$ 735 while de-activating two-stage op-amp section 710. Referring to FIG. 9, act 801 is shown as occurring at time $t_1$.

When capacitor $C_1$ 735 is charged, switch 725 may be closed and switch 730 opened (act 802). This point is shown in FIG. 9 at $t_2$. The determination of when capacitor $C_1$ 735 is charged may be based on, for example, measuring of the voltage at $V_{out}$ or based on a predetermined time interval derived from the RC constant of the circuit.

After act 802, op-amp section 710 will operate to stabilize the voltages at node $O_1$ and at $V_{out}$. Because capacitor $C_1$ 735 was pre-charged, this stabilization will occur relatively quickly relative to existing voltage regulator 100. At this point, voltage regulator component 620 is able to produce a stable output power (act 803).

During operation, when a load at $V_{out}$ attempts to draw more current than op-amp 720 is capable of supplying, capacitor $C_1$ 735 will assist in supplying the extra current (act 804). In this manner, temporary spikes in the load can be tolerated without disrupting the load. This can be particularly useful in the implementation in which voltage regulator component 620 is used to supply power to the bit lines $GBL_i$ of memory cells 301 during a program operation. Depending on the data that is to be written, the number of bit lines $GBL_i$ that will simultaneously require power may vary from, for example, as few as one to as many as 37. Each bit line sinks a fixed amount of current. Accordingly, the total load may vary from programming operation to programming operation by as much as a factor of 37. Capacitor $C_1$ 735 assists in handling these large load fluctuations.

As previously mentioned, by pre-charging capacitor $C_1$ 735, voltage regulator component 620 can provide an output current that exhibits less overshoot and faster settling times than conventional voltage regulators. In applications such as flash memory programming, this improved voltage regulator provides for improved programming reliability and speed with reduced pulse overshoot. FIG. 10 is a diagram illustrating overshoot for an exemplary pulse applied to a bit line $GBL_i$ during a programming operation. The pulse overshoot, POS, can be defined as the difference between the peak amplitude of the pulse and the desired steady-state pulse level. Additionally, the settling time, SET, is shown in FIG. 10 as the time for the pulse to settle into the desired steady-state value. Pulse overshoot can be most severe when switching from multiple bits that are to be simultaneously programmed (e.g., 37) in a first programming interval to a few bits that are to be programmed in a next programming interval (e.g., 1). In this situation, because each bit line requires a constant current supply, voltage regulator component 620 will experience a large current drain followed by a small current drain. This tends to cause pulse overshoot for the bit line(s) in the second programming interval. Voltage regulator component 620 may advantageously assist in reducing overshoot and settling time. In the context of operations on core area 202 of memory device 200, this can lead to less distribution of cell threshold voltage and improved sensing margin when reading memory cells.

Referring back to FIG. 8, at some point it may become desirable to float voltage regulator component 620 relative to its load (act 805). In this situation, switches 725 and 745 may be opened (act 806). This is shown as time $t_3$ in FIG. 9. In this state, voltage regulator component 620 is essentially disconnected from the load.

CONCLUSION

As described above, an improved voltage regulator can provide for less overshoot and faster settling times in the power supplied by the voltage regulator.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 8, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A memory device comprising:
   at least one array of non-volatile memory cells, each of the non-volatile memory cells being associated with at least one bit line and a word line; and
   a voltage supply component configured to supply power to the at least one array of non-volatile memory cells, the voltage supply component including a voltage regulator that includes:
   an operational-amplifier section,
      a capacitor connected to an output of the operational-amplifier section, and
      a switch configured to connect the capacitor and the output of the operational-amplifier section to a voltage supply, the switch being operated to pre-charge the capacitor, the pre-charged capacitor operating to stabilize the power supplied from the voltage supply component.

2. The memory device of claim 1, wherein the voltage regulator further includes:
   a second switch connected between first and second stages of the two-stage operational-amplifier, the second switch being configured to be in a non-conductive state while the capacitor is pre-charging.

3. The memory device of claim 2, further comprising:
   a resistor connected in parallel with the capacitor.

4. The memory device of claim 1, wherein the operational amplifier section includes:
   a first operational-amplifier configured as a differential operational-amplifier; and
   a second operational-amplifier connected at an input to an output of the first operational-amplifier and being configured as a unity gain operational amplifier.

5. The memory device of claim 4, wherein the operational amplifier section further includes:
   a second switch connected between the first and second operational-amplifiers, the second switch being configured to be in a non-conductive state while the capacitor is pre-charging.

6. The memory device of claim 5, wherein the operational amplifier section further includes:
   a second capacitor connected between the output of the operational-amplifier and the input of the second operational amplifier.

7. The memory device of claim 5, further comprising:
   control logic configured to control operation of the first and second switches.

8. The memory device of claim 1, wherein the voltage supply component further includes:
   a charge pump component configured to output a supply voltage to the voltage regulator.

9. The memory device of claim 1, wherein each of the non-volatile memory cells includes:
   a dielectric charge storage element configured to store at least two independent charges.

10. The memory device of claim 1, wherein the non-volatile memory cells are SONOS (silicon-oxide-nitride-oxide-silicon) type NOR memory cells.

11. A non-volatile memory device comprising:
    an array of non-volatile memory cells, each of the non-volatile memory cells being associated with at least one bit line and a word line; and
    a voltage regulator that includes:
    a two-stage operational-amplifier section, the two-stage operational-amplifier section including a first operational-amplifier configured as a differential operational-amplifier, and a second operational-amplifier configured as a unity gain operational amplifier and including an input connected to an output of the first operation-amplifier and an output connected as an output of the two-stage operational-amplifier section,
    a capacitor connected to an output of the two-stage operational-amplifier section, and
    a switch configured to connect the capacitor and the output of the two-stage operational-amplifier section to a voltage supply, the switch being operated to charge the capacitor before activating the two-stage operational-amplifier section.

12. The non-volatile memory device of claim 11, wherein the voltage regulator further includes:
    a second switch connected between the first and second operational-amplifiers, the second switch being configured to be in a non-conductive state while the capacitor is charging.

13. The non-volatile memory device of claim 11, wherein the array of non-volatile memory cells includes NOR-type Flash memory cells.

14. The non-volatile memory device of claim 11, wherein the capacitor is configured to store charge to supplement current being supplied from the operational-amplifier section.

* * * * *